US012656286B2

(12) United States Patent
Rajeh et al.

(10) Patent No.: US 12,656,286 B2
(45) Date of Patent: Jun. 16, 2026

(54) SMART HOLIDAY DETECTOR

(71) Applicant: Saudi Arabian Oil Company, Dhahran (SA)

(72) Inventors: Majed F. Rajeh, Riyadh (SA);
Ghassan M. Bahamden, Yanbu (SA);
Isa H. Mudaibegh, Dammam (SA);
Saleh S. Zubaidi, Jeddah (SA);
Ibrahim A. Omary, Riyadh (SA)

(73) Assignee: Saudi Arabian Oil Company, Dhahran (SA)

( * ) Notice: Subject to any disclaimer, the term of this patent is extended or adjusted under 35 U.S.C. 154(b) by 572 days.

(21) Appl. No.: 18/088,066

(22) Filed: Dec. 23, 2022

(65) Prior Publication Data

US 2024/0210339 A1     Jun. 27, 2024

(51) Int. Cl.
| | |
|---|---|
| *G01N 27/02* | (2006.01) |
| *G01R 31/14* | (2006.01) |
| *G06F 3/16* | (2006.01) |

(52) U.S. Cl.
CPC ........... G01N 27/028 (2013.01); G01R 31/14 (2013.01); *G06F 3/167* (2013.01)

(58) Field of Classification Search
CPC ........ G01N 27/028; G01R 31/14; G06F 3/167
See application file for complete search history.

(56) References Cited

U.S. PATENT DOCUMENTS

| | | | | |
|---|---|---|---|---|
| 3,066,256 | A | * | 11/1962 | Rasor ..................... G01N 27/90 |
| | | | | 324/67 |
| 3,259,893 | A | | 7/1966 | Parker |
| 3,810,007 | A | | 5/1974 | Wiseman et al. |
| 4,390,836 | A | * | 6/1983 | Bruce ................... G01R 31/58 |
| | | | | 324/559 |

(Continued)

FOREIGN PATENT DOCUMENTS

| | | | |
|---|---|---|---|
| JP | 2004053391 | * | 2/2004 |
| SA | 516380413 B1 | | 3/2021 |
| WO | WO 2021026236 | | 2/2021 |

OTHER PUBLICATIONS

SAIP Examination Report in Saudi Arabian Appln. No. 123451090, dated Mar. 18, 2025, 13 pages (with English translation).

*Primary Examiner* — Octavia Hollington
(74) *Attorney, Agent, or Firm* — Fish & Richardson P.C.

(57) ABSTRACT

A holiday detector system can include a holiday detector with a housing for holiday inspection circuitry to perform holiday inspection on a surface, a probe extending from the housing for surface inspection, the probe electrically coupled to the holiday inspection circuitry. The holiday detector system can also include a graphical user interface device electrically connected to the holiday detector. The graphical user interface device has a display screen and logic and circuitry to receive holiday inspection signals from the holiday detector apparatus; generate digital data representative of the holiday inspection signals; format the digital data into a graphical representation of the holiday inspection (Continued)

100 —

150 Advanced LED
160 Encoded wheel
170 Smart spray
180 Digital data handler

Holiday Detector GUI Device

BI: 10-1810
Location: PS-06 km 333
GPS: xxxx.xxx.xxxx
Tester: Ghassan
Voltage: 2400 volt
Speed: 300 mm/s

120

106
102
104
106

| 108 | 112 | 116 |
|---|---|---|
| Processor | Audio Out | Firmware |

| 110 | 114 | |
|---|---|---|
| Test CKT | Interface | | signals; display the graphical representation of the holiday inspection signals on the display screen; and digitally store the digital data in a data storage device. The holiday detector can communicate holiday inspection signals with the graphical user interface by a peripheral device interface, including an audio jack.

17 Claims, 6 Drawing Sheets

(56) References Cited

U.S. PATENT DOCUMENTS

| | | | | |
|---|---|---|---|---|
| 5,955,670 | A * | 9/1999 | Goodman | G01N 29/032 |
| | | | | 73/592 |
| 6,220,098 | B1 * | 4/2001 | Johnson | G01H 1/00 |
| | | | | 73/660 |
| 7,077,020 | B2 | 7/2006 | Langley et al. | |
| 8,030,946 | B2 * | 10/2011 | Brusco | G01B 21/08 |
| | | | | 324/559 |
| 9,205,467 | B2 | 12/2015 | Jaffarullah et al. | |
| 9,389,150 | B2 | 7/2016 | Kimpel, Jr. et al. | |
| 10,877,000 | B2 * | 12/2020 | Liu | G01N 27/9006 |
| 11,275,017 | B2 * | 3/2022 | Parrott | G01N 17/02 |
| 2013/0124109 | A1 * | 5/2013 | Denenberg | G01N 17/04 |
| | | | | 702/35 |
| 2017/0322182 | A1 * | 11/2017 | Zheng | G01N 27/83 |
| 2018/0356365 | A1 | 12/2018 | Liu et al. | |
| 2021/0041348 | A1 | 2/2021 | Parrott et al. | |
| 2025/0076240 | A1 * | 3/2025 | Campbell | G01R 31/14 |

* cited by examiner

400

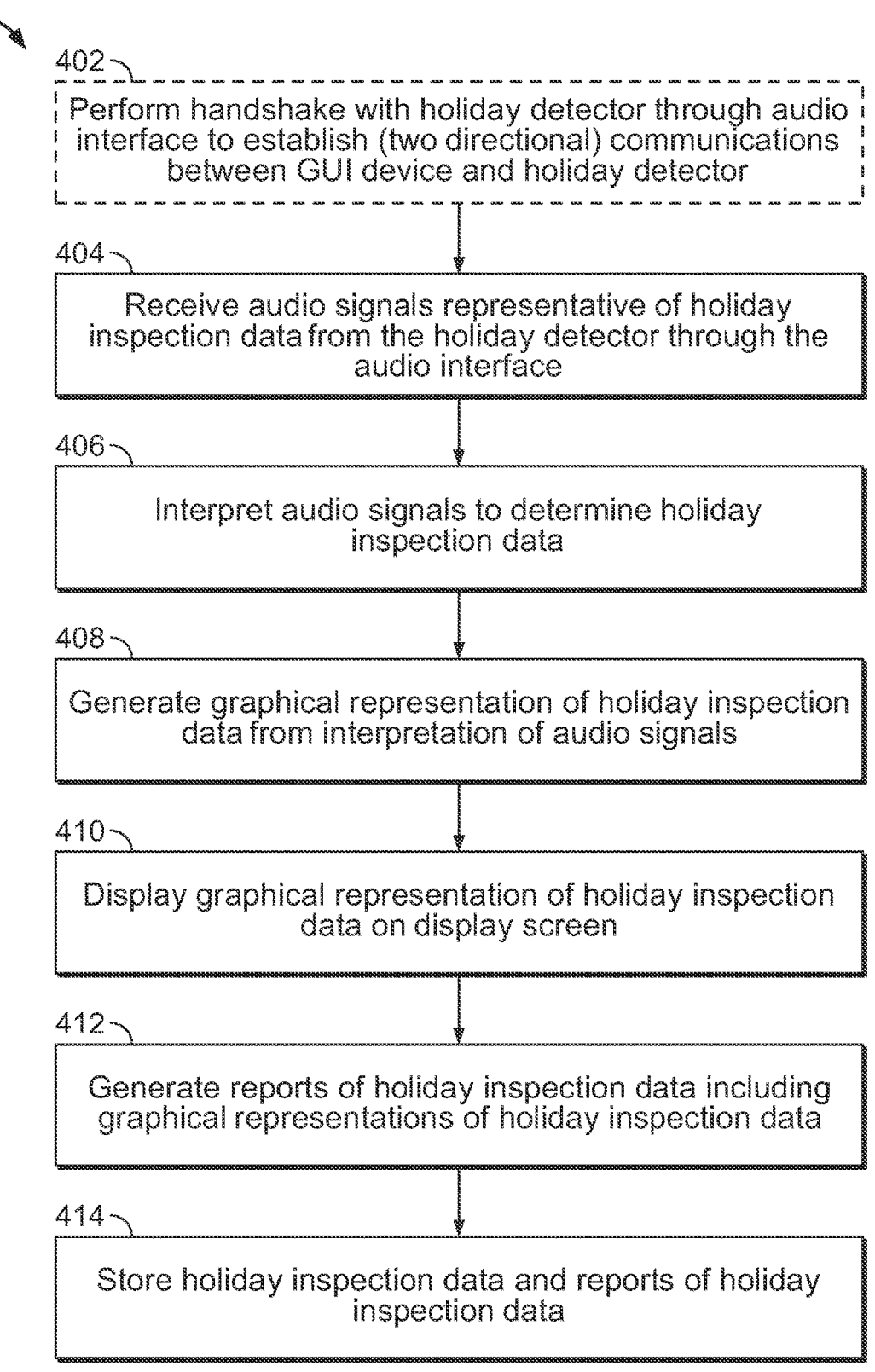

402

Perform handshake with holiday detector through audio interface to establish (two directional) communications between GUI device and holiday detector

404

Receive audio signals representative of holiday inspection data from the holiday detector through the audio interface

406

Interpret audio signals to determine holiday inspection data

408

Generate graphical representation of holiday inspection data from interpretation of audio signals

410

Display graphical representation of holiday inspection data on display screen

412

Generate reports of holiday inspection data including graphical representations of holiday inspection data

414

Store holiday inspection data and reports of holiday inspection data

FIG. 4

SMART HOLIDAY DETECTOR

FIELD

This disclosure pertains to a smart holiday detector for identifying defects in protective coatings.

BACKGROUND

Holiday testing involves the non-destructive analysis of non-metallic layers to determine the presence and location of defects in the non-metal or insulating layers. A holiday detector can use electricity to determine whether a defect in a non-metal or insulating layer will permit the passage of current between the holiday detector and metal layers beneath the non-metal or insulating layer.

SUMMARY

The present disclosure describes techniques that can be used for identifying defects in protective coatings or other types of non-metal layering using a smart holiday detector in accordance with embodiments of the present disclosure.

In some implementations, a computer-implemented method includes the following.

Aspects of the embodiments are directed to a holiday detector system that includes a holiday detector apparatus. The holiday detector apparatus includes a housing comprising holiday inspection circuitry to perform holiday inspection on a surface, and a probe extending from the housing for surface inspection, the probe electrically coupled to the holiday inspection circuitry. The holiday detector system also include a graphical user interface device electrically coupled to the holiday detector apparatus, the graphical user interface device comprising a display screen and circuitry to receive holiday inspection signals from the holiday detector apparatus, generate digital data representative of the holiday inspection signals, format the digital data into a graphical representation of the holiday inspection signals, display the graphical representation of the holiday inspection signals on the display screen, and digitally store the digital data in a data storage device.

In some embodiments, the holiday detector apparatus comprises a peripheral device interface to receive a connector for a peripheral device; and wherein the graphical user interface device is electrically coupled to the holiday detector by the peripheral device interface.

In some embodiments, the peripheral device interface comprises an audio jack, and wherein the graphical user interface device is electrically connected to the holiday detector through the audio jack and is configured to receive the holiday inspection signals from the holiday detector apparatus through a connection to the audio jack.

In some embodiments, the graphical user interface device comprises logic and circuitry to convert audio outputs from the holiday detector that represent holiday inspection signals into graphical representations of the holiday inspection signals; and display the graphical representations of the holiday inspection signals on the display screen.

In some embodiments, the graphical user interface device comprises a satellite-based positioning system, and logic and circuitry to receive an indication of a presence of a holiday from the holiday detector; determine a position of the holiday detector based on a position of the holiday detector using the satellite-based positioning system; store the position of the holiday using coordinates from the satellite-based positioning system; and display the position of the holiday on the display screen.

In some embodiments, the graphical user interface comprises a communication interface to send digital data to a communications device.

In some embodiments, the graphical user interface device comprises a module interface for connecting modular accessories to the graphical user interface by a wired or by a wireless connection.

Some embodiments also include a light emitting diode (LED) mechanically coupled to the probe and communicably coupled to the graphical user interface device through the module interface, the graphical user interface device comprising logic and circuitry to control the LED to illuminate in response to the holiday detector detecting a holiday during a holiday inspection of the surface.

Some embodiments also include a smart sprayer mechanically coupled to the probe and communicably coupled to the graphical user interface device through the module interface, the graphical user interface device comprising logic and circuitry to cause the smart sprayer to emit paint onto the surface based on the detection of a holiday by the holiday detector during a holiday inspection of the surface.

Some embodiments also include an encoded wheel mechanically coupled to the holiday detector and communicably coupled to the graphical user interface through the module interface, the encoded wheel configured with rotational tracking data to determine a distance traveled; and wherein the graphical user interface device comprises logic and circuitry to receive movement data from the encoded wheel and to determine a distance travelled by the holiday detector based on movement data received from the encoded wheel.

In some embodiments, the encoded wheel comprises a magnetic element to secure the encoded wheel to the surface, the graphical user interface device further comprising logic and circuitry to control the encoded wheel to move along the surface at a predetermined speed.

Aspects of the embodiments are directed to a computer-implemented method that includes receiving, by a graphical user interface device electrically connected to an audio output jack of a holiday detector, an auditory signal representing holiday inspection analysis data from the holiday detector from a holiday inspection of a surface; converting the auditory signal into a graphical representation of the holiday inspection analysis data; displaying the graphical representation on a display screen of the graphical user interface device; and storing the data in a data storage device.

Some embodiments also include receiving, by the graphical user interface device, an audio signal comprising an indication of a presence of a holiday on the surface from the holiday detector; determining a position of the holiday detector based on a position of the holiday detector using a satellite-based positioning system in communication with a processor of the graphical user interface device; storing the position of the holiday using coordinates from the satellite-based positioning system; and displaying the position of the holiday on the display screen.

Some embodiments can also include receiving, by the graphical user interface device, an audio signal comprising an indication of a presence of a holiday on the surface from the holiday detector; and controlling and LED coupled to the holiday detector to illuminate a location of the holiday in response to the holiday detector detecting the presence of the holiday during a holiday inspection of the surface.

Some embodiments can also include receiving, by the graphical user interface device, an audio signal comprising an indication of a presence of a holiday on the surface from the holiday detector; and causing, by the graphical user interface device, a sprayer to emit paint onto the surface based on the detection of a holiday by the holiday detector during a holiday inspection of the surface.

Some embodiments can also include receiving, receiving movement data from an encoded wheel coupled to the holiday detector; and determining a distance travelled by the holiday detector based on movement data received from the encoded wheel.

In some embodiments, the encoded wheel comprises a magnetic element to secure the encoded wheel to the surface, the method further comprising controlling, by the graphical user interface device, the encoded wheel to move along the surface at a predetermined speed.

Aspects of the embodiments include one or more non-transitory computer-readable storage media storing instructions that, when executed by one or more hardware processors, perform operations that include receiving, by a graphical user interface device electrically connected to an audio output jack of a holiday detector, an auditory signal representing holiday inspection analysis data from the holiday detector from a holiday inspection of a surface; converting the auditory signal into a graphical representation of the holiday inspection analysis data; displaying the graphical representation on a display screen of the graphical user interface device; and storing the data in a data storage device.

In some embodiments, the operations further comprise receiving, by the graphical user interface device, an audio signal comprising an indication of a presence of a holiday on the surface from the holiday detector; determining a position of the holiday detector based on a position of the holiday detector using a satellite-based positioning system in communication with a processor of the graphical user interface device; storing the position of the holiday using coordinates from the satellite-based positioning system; and displaying the position of the holiday on the display screen.

In some embodiments, the operations further comprise receiving, by the graphical user interface device, an audio signal comprising an indication of a presence of a holiday on the surface from the holiday detector; and controlling and LED coupled to the holiday detector to illuminate a location of the holiday in response to the holiday detector detecting the presence of the holiday during a holiday inspection of the surface.

In some embodiments, the operations further comprise receiving, by the graphical user interface device, an audio signal comprising an indication of a presence of a holiday on the surface from the holiday detector; determining a position of the holiday detector based on a position of the holiday detector using a satellite-based positioning system in communication with a processor of the graphical user interface device; storing the position of the holiday using coordinates from the satellite-based positioning system; and displaying the position of the holiday on the display screen.

In some embodiments, the operations further comprise receiving, by the graphical user interface device, an audio signal comprising an indication of a presence of a holiday on the surface from the holiday detector; and controlling and LED coupled to the holiday detector to illuminate a location of the holiday in response to the holiday detector detecting the presence of the holiday during a holiday inspection of the surface.

In some embodiments, the operations further comprise receiving, by the graphical user interface device, an audio signal comprising an indication of a presence of a holiday on the surface from the holiday detector; and causing, by the graphical user interface device, a sprayer to emit paint onto the surface based on the detection of a holiday by the holiday detector during a holiday inspection of the surface.

In some embodiments, the operations further comprise receiving, receiving movement data from an encoded wheel coupled to the holiday detector; and determining a distance travelled by the holiday detector based on movement data received from the encoded wheel.

In some embodiments, the encoded wheel comprises a magnetic element to secure the encoded wheel to the surface, the operations further comprise controlling, by the graphical user interface device, the encoded wheel to move along the surface at a predetermined speed.

Aspects of the embodiments are directed to a software application comprising code that includes instructions that, when executed by a hardware processor, perform operations. the software application can include code to control the LED, the smart sprayer, the encoded wheel, the robotic system, and the holiday detector apparatus. The software application can also include code that includes instructions that, when executed by a hardware processor, perform operations, including receiving data from one or more of the LED, the smart sprayer, the encoded wheel, the robotic system, the holiday detector apparatus, the GPS, and other components, across a wired or wireless communications link. The software application can be downloaded onto a mobile device, such as a tablet PC, smartphone, or other type of mobile computing and communications device. The software application can provide a graphical user interface to control one or more of the holiday detector apparatus system features, including receiving data, generating reports, storing data and reports, emailing reports and data to other devices, etc. The software application can also mirror the holiday detector GUI device.

The previously described implementation is implementable using a computer-implemented method; a non-transitory, computer-readable medium storing computer-readable instructions to perform the computer-implemented method; and a computer-implemented system including a computer memory interoperably coupled with a hardware processor configured to perform the computer-implemented method/ the instructions stored on the non-transitory, computer-readable medium.

The subject matter described in this specification can be implemented in particular implementations, so as to realize one or more of the following advantages. For example, in certain embodiments, a smart user interface can integrate with a holiday detector to create a smart holiday detector with enhanced features, such as wireless communications capabilities, data storage, graphical user interface for representing data and findings, GPS capabilities for pinpointing defects in remote areas, mirroring capabilities to partner with mobile devices, and other capabilities. Other advantages will be readily apparent to those of skill in the art through the disclosure provided herein. For example, aspects of the embodiments can work individually or in concert to identify exact the location of a defect on the surface of an asset in the field, while also providing information about the linear distance covered, along with speed. In some embodiments, the operator can control a robotic unit, which can keep the operate safe while performing holiday inspection on field assets in dangerous areas.

The details of one or more implementations of the subject matter of this specification are set forth in the Detailed Description, the accompanying drawings, and the claims. Other features, aspects, and advantages of the subject matter will become apparent from the Detailed Description, the claims, and the accompanying drawings.

BRIEF DESCRIPTION OF THE DRAWINGS

FIG. 4 is a process flow diagram for using a graphical user interface device connected to a holiday detector for processing, displaying, and recoding holiday inspection data in accordance with embodiments of the present disclosure.

Like reference numbers and designations in the various drawings indicate like elements.

DETAILED DESCRIPTION

The following detailed description describes systems and techniques for a holiday detection system with a connected graphical user interface device that can provide additional functionality and control connected peripheral devices to improve holiday inspection and analysis of production assets. Various modifications, alterations, and permutations of the disclosed implementations can be made and will be readily apparent to those of ordinary skill in the art, and the general principles defined may be applied to other implementations and applications, without departing from scope of the disclosure. In some instances, details unnecessary to obtain an understanding of the described subject matter may be omitted so as to not obscure one or more described implementations with unnecessary detail and inasmuch as such details are within the skill of one of ordinary skill in the art. The present disclosure is not intended to be limited to the described or illustrated implementations, but to be accorded the widest scope consistent with the described principles and features.

This disclosure describes an enhanced holiday detector that includes a modular graphical user interface device that can be used to control the holiday detector via a firmware handshake. The graphical user interface device can also interpret signals from the holiday detector, generate graphical reports, and store digital reports with holiday inspection data for later consumption or analysis. The graphical user interface device of the present disclosure also facilitates the includes of a wide range of accessories and peripheral devices to enhance the overall holiday inspection process. Among the accessories and peripherals supported by this disclosure for enhancing the holiday detector include a light emitting diode (LED), a distance measuring encoder, a smart spray, digital reporting, and a mounted robot with magnetic, encoded wheels.

These features will contribute in the enhancement of the current limitations and challenges through having a permanent testing records as part of the smart interface screen. It will enhance the identification of defect location through utilization of Advanced holiday testing ring equipped with LED lighting and smart spray system. Controlling of the holiday detector speed movement is achieved by using an encoder for axial travel distance recording. Finally, the holiday detector system will employ digital interface device that will provide a platform for digitalizing the test results, report generation and maintaining of the holiday testing records for retention of data for future reference.

Figure 1:
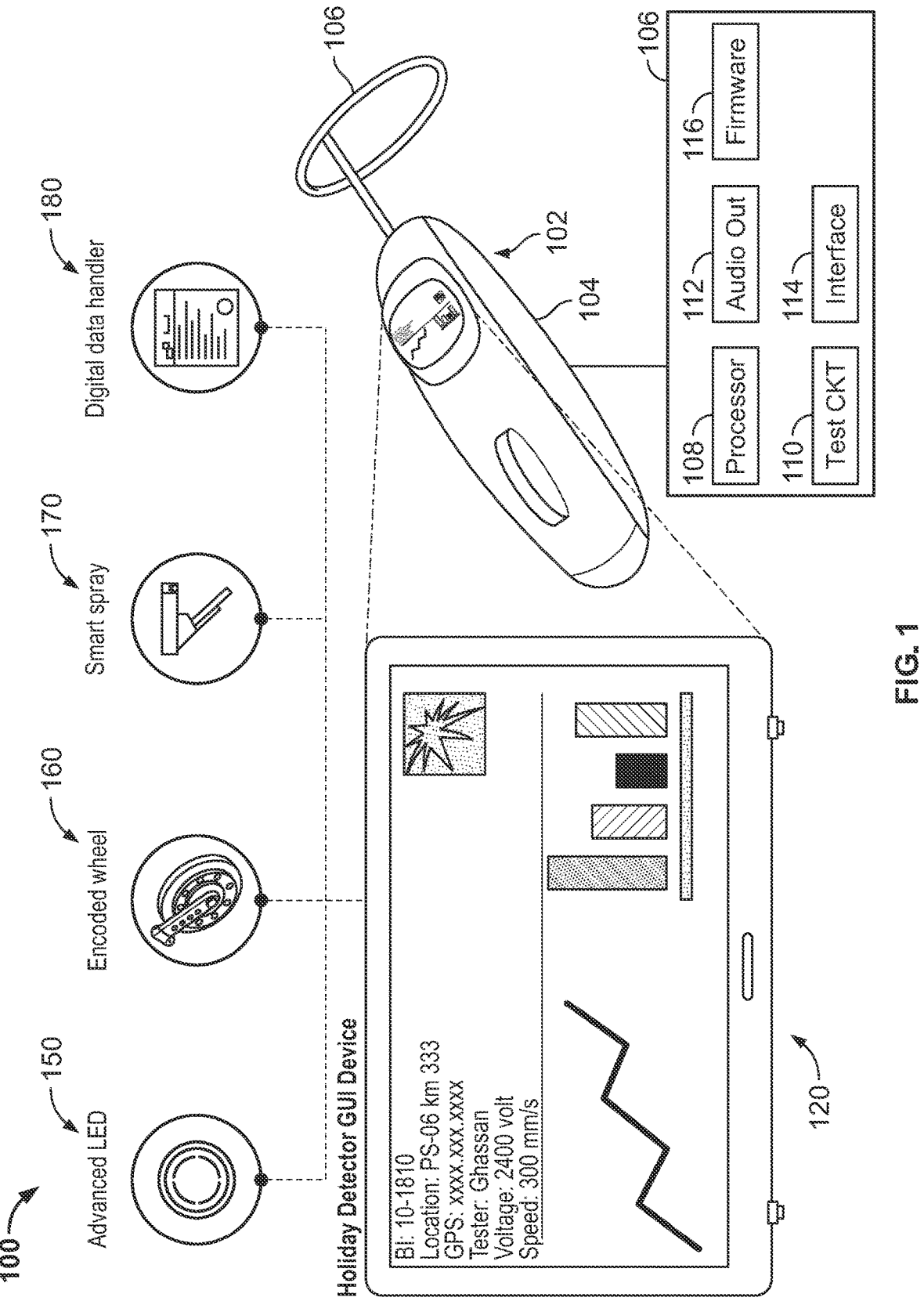
FIG. 1 is a schematic diagram of a holiday detection system that include a holiday detector with a connected holiday detector interface device and peripheral devices in accordance with embodiments of the present disclosure.

FIG. 1 is a schematic diagram of a holiday detection system 100 that include a holiday detector apparatus 102 with a connected holiday detector interface device 120 and accessories in accordance with embodiments of the present disclosure. The holiday detector apparatus 102 can be a handheld or self-propelled holiday detector. The holiday detector apparatus 102 can include a housing 104 that houses circuitry for detecting defects in insulating and other non-metallic coatings. For example, defects in coatings can develop over time or can be caused though the formation of the non-metal layers. Defects can include pinholes, abrasions, cracks, or other types of defects in the non-metal layers. The housing 104 can house a hardware processor 108, which can be a microprocessor or other type of processing device. The hardware processor 108 can operate using firmware 116, which can provide control commands and perform other functions. The firmware 116 for example, can perform handshake functions with a peripheral device coupled to the interface 114. The housing 104 can include a test circuit 110 for generating the requisite electrical signals to the probe 106 and for determining the presence of a holiday or other type of defect in the non-metal layer(s). The test circuitry 110 can trigger an audible tone or audible signal to indicate the presence of a holiday or other defect through an audio output 112. The audio output 112 can also be provided through interface 114, which can be an audio jack.

The holiday detector apparatus 102 operates by completing a circuit or detecting current flow or an opposing magnetic field due to current flow. During holiday testing, a ground wire and probing electrode are attached to the same power source. The ground wire is clamped to the specimen being tested while the probe is swept across the surface of the metal substrate. The holiday detector apparatus 102 impresses an electrical voltage across the coated area to identify coating damages. Any passing of current will actuate an alarming signal of the defect. The inspector can mark these defected areas for repair. There are several types of holiday detector electrodes; wet sponge low voltage, Rolling springs, and copper-bronze bristle brushes. These electrodes are used depending on their applications. Those used on pipeline usually are rolling springs electrode due to the wide circumference/area of coverage. For flat surface areas, copper-bronze bristle brushes or wet sponge are usually used so that the electrode moves along the painted surface by the operator. Ring-based probes can also be used on pipes and pipelines for analyze 360 degree circumference of the pipe.

The holiday detector apparatus 102, for example, can include a probe 106. Probe 106 can include a ring for carrying a current for detecting the defect. Probe 106 can also include a metal brush that brushes along the coating and contacts underlying metal through small openings in the non-metal layer. Other types of probe are contemplated. As discussed before, when the defect is detected, the test circuitry 110 can trigger an audible signal to alert an operator of the presence of the defect.

The holiday detection system 100 of the present disclosure includes a holiday detector interface device 120 that can couple to the holiday detector apparatus 102, as shown in FIG. 1. Generally, the holiday detector interface device 120 can provide a graphical user interface for controlling the holiday detector 120, receiving and viewing holiday inspection data, and can act as an interface for controlling peripheral devices and accessories. The holiday detector interface device 120 can turn the holiday detector into a so-called "smart" holiday detector by integrating with the holiday detector to provide additional functionality and by controlling the peripheral devices. More details about the holiday detector interface device 120 are discussed in the text accompanying FIG. 2.

The holiday detector interface device 120 can support a plurality of peripheral devices and enhanced functionalities. For example, the holiday detector interface device 120 can support the inclusion of an LED 150. The LED 150 can be mechanically coupled to the holiday detector at a location proximate to the probe 106. In embodiments that use a ring-style probe 106, the LED can be an LED ring that is adjacent the ring probe 106. The LED 150 can be electrically connected to the holiday detector interface device 120 (e.g., via a module interface 206 shown in FIG. 2). The holiday detector interface device 120 can cause the LED to illuminate upon a determination by the holiday detector interface device 120 that a signal received from the holiday detector indicates the presence of a defect. The LED 150 can illuminate a location on the surface of the production asset being inspected where the defect is located. This way, the defect can be optically inspected by an operator. A plurality of individual LEDs can be used. For example, for a probe 106 that uses a ring-shape, the LED 150 can include a ring of individual LEDs, each individually controllable to illuminate upon detection of a defect by the holiday detector apparatus 102. This way, a defect on a particular point along a circumference of a surface of a pipe or other asset can be detected and observed locally. LED illumination can be accompanied by auditory tones or signals to provide redundant and alternative forms of signaling when a holiday defect is found. The auditory signals can be emitted from an audio output device on the holiday detector interface device 120 or from the holiday detector apparatus 102 (or both).

The holiday detector interface device 120 can also receive distance information from one or more encoded wheels 160. The encoded wheel 160 can be attached to the holiday detector (e.g., near or on the probe 106) to measure the distance travelled along the pipeline surface and the recorded speed. The encoded wheel 160 supports identifying the linear position of the defect along the pipeline, either in absolute terms or in relativistic terms, depending on the manner the encoded wheel 160 is encoded with information about distance, position, etc. The encoded wheel 160 can be used alone or in concert with the LED 150 to identify the exact location of the defect(s). The encoded wheel 160 can be communicated with the holiday detector interface device 120 through wired or wireless connection for analyses and presentation (such as on the display screen of the holiday detector interface device or onto another connected device).

The holiday detector interface device 120 can also control a smart spray 170 to spray paint or other visually observable and adhesive substance to mark the location of a defect. The smart spray can be fixed around the holiday detector probe 106 to create a visual mark at the location on the surface where the defected was located during the holiday inspection. The smart spray 170 can help in identifying the exact location of the defect, which will contribute accordingly in reducing the amount of time consumed for performing holiday inspection. The smart spray 170 can be an additional feature to support the identification of the defect location along with the LED 150. The smart spray 170 can be controlled by the holiday detector interface device 120 by a wired or wireless connection. For example, the holiday detector interface device 120 can receive a signal from the holiday detector apparatus 102 indicating the presence of a defect, and upon determining that the defect is present (i.e., by interpreting the signal accordingly), the holiday detector interface device 120 can send a signal to the smart spray 170 to activate and emit paint or other material onto the surface. In embodiments, the smart spray 170 can include different types of paint or different paint colors. The holiday detector interface device 120 can receive signal from the holiday detector apparatus 102 that a certain type of defect has been detected, and depending on the type of defect, the holiday detector interface device 120 can control the smart spray to spray a certain color of paint at the location of the defect. The coordination of color to defect type is implementation specific. In some embodiments, the holiday detector interface device 120 can cause the smart spray 170 to emit paint of a selected color every few meters to indicate that the area has been checked and that no defects were found. This way, visual inspection of the surface can be done to verify that the area was inspected and that no defects were found.

The smart spray can also communicate information with the holiday detector interface device 120 to indicate spray status (spraying, done spraying, etc.) and to indicate a level of paint or other material within the smart spray 170. For example, the smart spray can track paint levels and indicate to the holiday detector interface device 120 what the level is, how much paint remains, low paint warning, etc. The holiday detector interface device 120 can display the levels, warnings, etc., on the display screen and/or can provide auditory signals to alert the operator of the presence of a defect in the surface coating.

The holiday detector interface device 120 can also include a digital data handler 180. The digital data handler 180 can perform various digital operations, such as 1) interpreting signals received from the holiday detector; 2) generating digital data corresponding to the signals and digital data corresponding to information received from peripheral devices; 3) generating customized digital reports based on the digital data and associating the reports with the digital data; and 4) storing the digital data and the reports in local digital storage or a connected digital storage (e.g., cloud-based storage). The digital data handler 180 can create digital versions of reports from holiday inspection data created based on signals received from the holiday detector apparatus 102 and from peripheral devices, such as the encoded wheel 160. The digitalization of the reported data can ensure control of testing results and maintaining and retaining of records. The digital data handler 180 can generate a master data set that can be retrieved any time for analytic and process enhancement.

Figure 2:
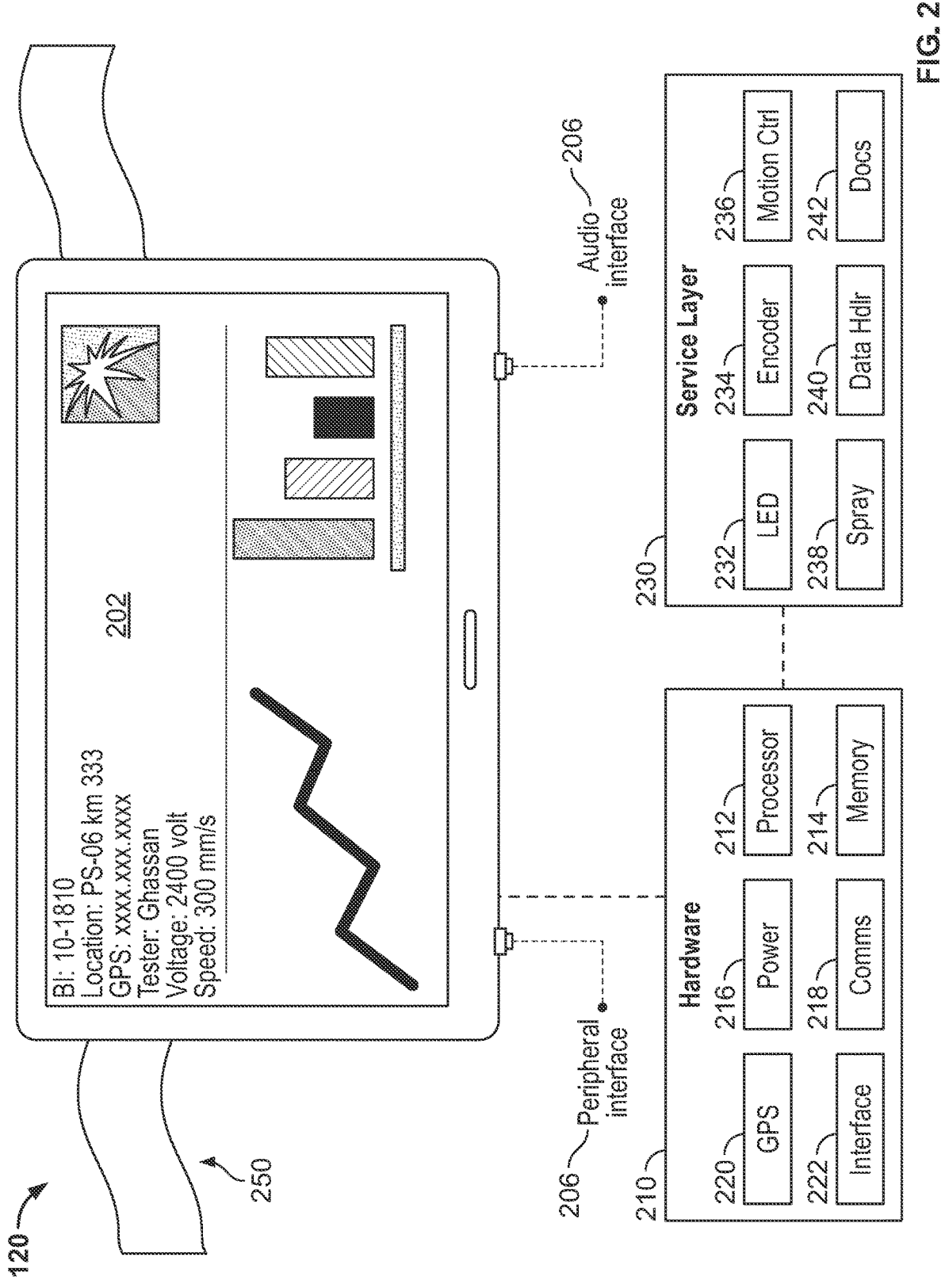
FIG. 2 is a schematic diagram of an example holiday detector interface device for a holiday detector in accordance with embodiments of the present disclosure.

The holiday detector interface device 120 is described in more detail in FIG. 2. FIG. 2 is a schematic diagram of an example holiday detector interface device 120 for a holiday detector in accordance with embodiments of the present disclosure. The holiday detector interface device 120 can create a digital holiday inspection environment to any hand-held or self-propelled holiday detector apparatus, such as holiday detector apparatus 102. The holiday detector inter- face device 120 can provide a graphical user interface (GUI) for controlling the holiday detector apparatus, controlling the testing parameters, receiving the testing results, and providing a GUI for viewing results. The holiday detector interface device 120 can transfer the manual operation of holiday testing to an advanced GUI representation, which provides an operator the ability to control various aspects of the holiday detector from the holiday detector interface device 120 (e.g., by a display screen 202 or other user interface). The holiday detector interface device 120 can also provide an operator with control over various holiday inspection parameters, which can include the control of all testing parameters such as input/output voltage, coating types and thickness, along with testing duration. The holiday detector interface device 120 can improve the overall quality test records through controlling of testing inputs that could altered or manipulated during the holiday testing.

In addition, the holiday detector interface device 120 can also be used to receive signals from the holiday detector apparatus 102 representative of holiday inspection data, interpret the signals to create digital holiday inspection data, generate graphical representations of the digital holiday inspection data for visual display on a display screen, generate digital reports from digital holiday inspection data, and store the digital reports with the digital holiday inspec- tion data for later analysis, record keeping, and other uses.

Figure 6:
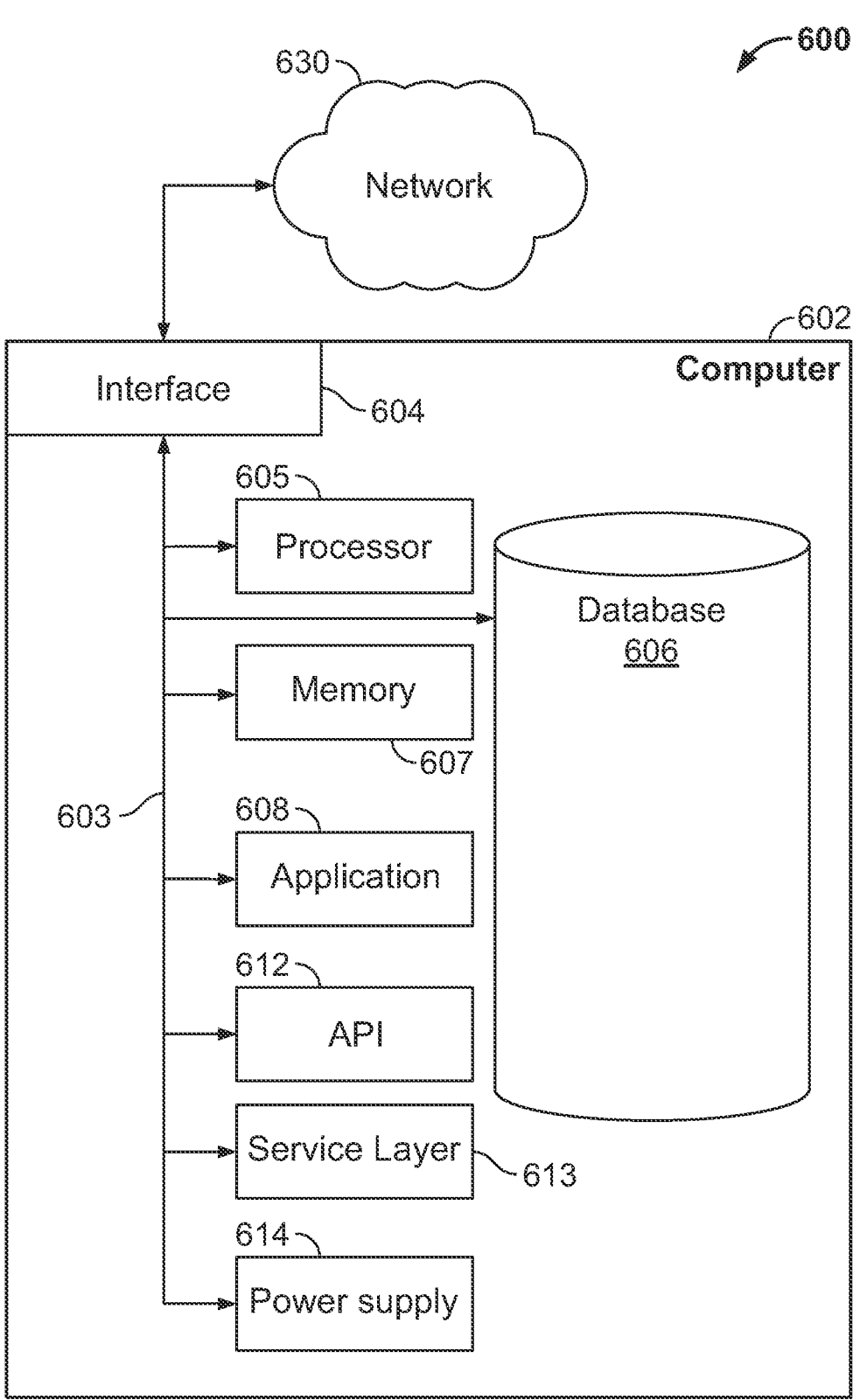
FIG. 6 is a block diagram illustrating an example computer system used to provide computational functionalities associated with described algorithms, methods, functions, processes, flows, and procedures as described in the present disclosure, according to some implementations of the present disclosure.

Generally, the holiday detector interface device 120 can be considered a computing device, similar to that described in FIG. 6. The holiday detector interface device 120 includes one or more hardware processors 212 that can execute instructions stored in memory 214. The one or more hard- ware processors 212 can be similar to processor 605 described in more detail below. The holiday detector inter- face device 120 can also include power supply 216. Power supply 216 can be similar to power supply 614. The power supply 216 can supply power to the holiday detector inter- face device 120 as well as to peripheral devices, such as the LED 150, encoded wheel 160, and smart spray 170.

The holiday detector interface device 120 can include a communications module 218. The communications module 218 can include hardware, software, or a combination of hardware and software to facilitate two-way communica- tions between the holiday detector interface device 120 and other devices, including peripheral devices, mobile devices (e.g., smartphones, laptops, etc.), cloud-based processing and storage, and elsewhere. The communications module 218 can support communications using wired or wireless communications protocols, including but not limited to Wi-Fi, Bluetooth, cellular, USB or other serial port connec- tion protocol, RCA, 3.5 mm audio, peripheral connection, etc. The communication module 218 allows the holiday detector interface device 120 to communicate with the other parts of the device or other equipment through a mirror application. The communications module 218 can also sup- port wireless communications using, e.g., a cellular com- munications protocol. For example, the operator can send text messages, voice messages, or can make voice calls via the communications module 218 when configured with cellular communications capabilities, such as those sup- ported by 3GPP.

The holiday detector interface device 120 can be equipped with a satellite-based positioning tool 220, such as a global positioning system (GPS) or global navigation satellite system (GNSS), for identifying test location coordinates. The satellite-based positioning tool 220 can track the precise location of the holiday detector apparatus 102. The satellite- based positioning tool 220 can record the coordinates of the holiday detector apparatus 102 in response to a defect detection. The holiday detector interface device 120 can record the coordinates of the holiday detector apparatus 102 with the holiday inspection data and in digital reports. That way, the defect location can be identified quickly and repair teams dispatched to precise locations, which is particularly important when inspecting large pipelines in remote loca- tions.

The holiday detector interface device 120 can include a plurality of interfaces 222. For example, the holiday detector interface device 120 can include a display screen 202. The display screen 202 can be used by an operator to control the holiday detector apparatus 102 and the testing parameters, as well as to view holiday inspection data and digital reports. The operator can use the display screen 202 to interface with other functionalities, such as sending digital reports to other devices and storage across a network, customizing digital reports, controlling encoded wheel movement or robotic movement, customizing paint colors for defect types, cus- tomizing distance traveled by the holiday detector for non- defect color spray, adding or removing programs, perform- ing software and/or firmware updates, deleting data, etc. In embodiments, the display screen 202 can include a touch screen.

Another example of an interface 222 includes audio inputs and outputs. For example, the holiday detector inter- face device 120 can include a microphone and speaker. The microphone can be used to receive voice inputs or to receive auditory signals from the holiday detector apparatus 102. Auditory signals can indicate the presence of a defect, for example. Voice inputs can include voice commands for controlling the holiday detector interface device 120 as described above, or can include communications inputs, such as voice-to-text for messaging or voice calls, if the holiday detector interface device 120 is used as a wireless communications device. The holiday detector interface device 120 can also support smart assistant technology, which can include artificial intelligence based technology to interpret commands and execute instructions based on the commands.

Another interface 222 supported by the holiday detector interface device 120 includes an audio jack interface 204. In embodiments, the holiday detector apparatus 102 can include an audio output port (or audio jack). The holiday detector apparatus 102 can emit an auditory signal to indi- cate the presence of a defect, for example. Other auditory signals can be used. Different auditory signals can represent different things, such as the type of defect or the severity of the defect. For example, a very small defect might only result in a small change in electrical response, and thus, the small change in electrical response can trigger a first audi- tory tone indicating a small defect; a larger defect might result in a larger change in electrical response. A second auditory tone can indicate a larger defect. A pinhole defect might result in a different electrical response than an abra- sion. Other correlations between type and severity of defect with the resulting auditory tone are contemplated by this disclosure. The holiday detector interface device 120 can interface with the audio output port of the holiday detector apparatus 102 to receive electrical signals corresponding to auditory signals representative of holiday inspection data, including the presence of a defect, and if possible, the type and severity of the defect. The holiday detector interface device 120 can receive the electrical signals through an audio jack 204. The holiday detector interface device 120 can then interpret the electrical signals corresponding to auditory signals and generate a graphical representation of the holiday inspection data for display on the display screen 202 and for digital report generation. The auditory signals can be translated in a form of graphs indicating the defects by the holiday detector interface device 120. The other attached peripherals can be displayed as icons or other visual representations on the display screen, and can provide graphical or other visual representations for GPS coordinates, voltage and speed.

As mentioned before, the holiday detector interface device 120 can support the inclusion of multiple peripheral devices, such as LED 150, encoded wheel 160, and smart spray 170, among others. The holiday detector interface device 120 can communicate with the peripheral devices using a wireless communications protocol, such as Bluetooth or Wi-Fi. The holiday detector interface device 120 can communicate with the peripheral devices using a wired connection through, for example, module interface 206. Module interface 206 can support one or more connected peripheral devices. The holiday detector interface device 120 can include a plurality of module interfaces. Module interface 206 can ports and supporting hardware for one- or two-directional communications between the holiday detector interface device 120 and a connected peripheral device.

Memory 214 can include any non-transitory, computer-readable storage medium storing instructions that, when executed by one or more hardware processors, can cause the holiday detector interface to perform operations. Memory 214 can be similar to memory 607 described below. The memory 214 can store instructions for various aspects of the holiday detector interface device 120 at the service layer 230 (service layer 230 is similar to service layer 613 described below). For example, the memory 214 can store instructions for data handler 240. Data handler 240 can include a plurality of algorithms for handling various types of data that are received by the holiday detector interface device 120. In one example, data handler 240 can interpret signals received from the holiday detector apparatus 102 and generate digital data corresponding to the signals received from the holiday detector apparatus 102. The data handler 240 can also format the digital data for displaying on the display screen 202 in a graphical form selected by the operator. The data handler 240 can also interface with a documents generator 242 to generate digital reports from the digital data, as well as associate any selected data with the digital reports, such as location information, spray colors, distance information, etc. Documents generator 242 can be a software program that can create digital documents that include holiday inspection data and analysis information. The documents generator 242 can provide an interface for the operator to customize reports, view reports on the display screen 202, and send reports to storage and to other devices.

The service layer instructions can also include LED control instructions 232. LED control instructions 232 can cause an LED 150 to illuminate based on the reception of a defect detected by the holiday detector apparatus 102. The LED control instructions 232 can illuminate a specific LED from a plurality of LEDs based on a defect found at a particular point on the surface of, e.g., a pipe with a circular cross section. The LED control instructions can, thus, activate a specific LED 150 of a plurality of LEDs to visually indicate the location of a defect on the surface as a result of the holiday inspection.

The encoder algorithm 234 can receive encoder wheel data from the encoded wheel 160, and process encoder wheel data to determine distance traveled by the holiday detector or to correlate distance traveled with instances of defect detection. The encoder algorithm 234, thus, can include one or more algorithms to perform calculations on encoded wheel data to make determinations about distance traveled or identify the location of defects. In embodiments, the encoder algorithm 234 works in concert with the motion controller 236 to cause the encoded wheel to move. For example, in embodiments where the holiday detection system 100 is coupled to a robotic system, such as that described in FIG. 3, the motion controller 236 can provide instructions to control the robotic system to move using, e.g., information from encoder algorithm 234. Encoder algorithm 234 can also provide operational support for the encoder wheel 160, such as drivers, encoding updates, diagnostic tools, etc.

Figure 3:
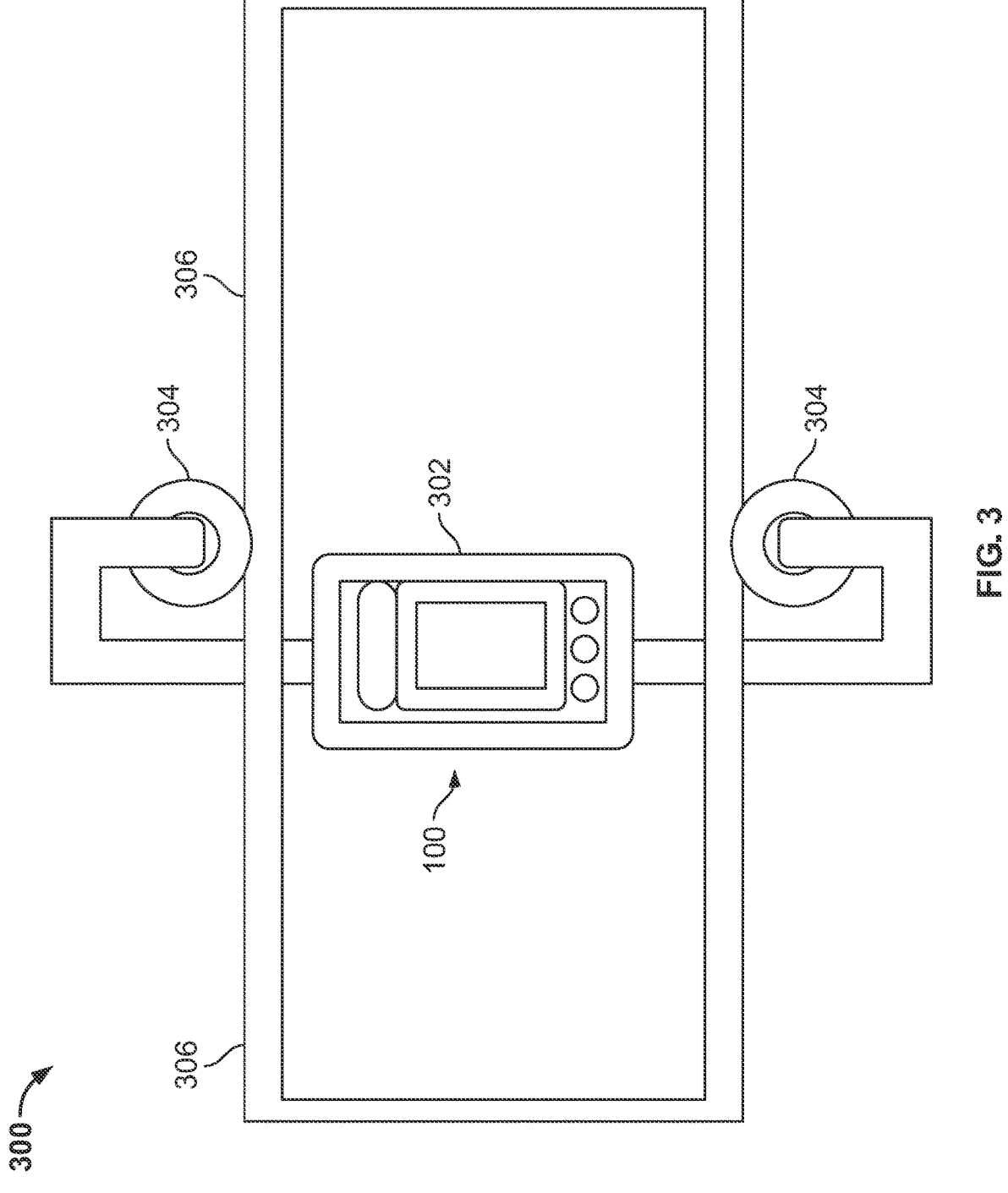
FIG. 3 is a schematic diagram of an example robotic system for a holiday detection system in accordance with embodiments of the present disclosure.

The motion controller 236 can include algorithms to operate the robotic system of FIG. 3 autonomously or semi-autonomously. The motion controller 236, in some embodiments, operate independently from other service layer systems. In some embodiments, the motion controller 236 can rely on information received from other service layer system to intelligently move the holiday detection system 100 during a holiday inspection. For example, the detection of a defect can cause the motion controller 236 to stop the motion of the robotic system to allow time for the peripheral devices to operate (e.g., time for the sprayer to spray, LED to light up, GPS to establish GPS coordinates, etc.). The motion controller 236 can also move the robotic system backwards and forwards in an area near the defect detection location to repeat the test or to retest areas near the defect detection location. The motion controller 236 can also use information from encoder algorithm 234 and satellite-based positioning tool 220 to determine motion control information, location information, distance travelled, distance remaining, etc. The motion controller 236 can use that information to autonomously or semi-autonomously move the holiday detection system 100 through the holiday inspection.

The service layer 230 can also include spray algorithms 238. Spray algorithms 238 can include software for controlling operation of the smart spray 170. The spray algorithms 238 can cause the smart spray 170 to emit paint of a particular color at a location based on holiday inspection signals. The smart spray algorithms can also control updates and diagnostics for the smart spray 170. The smart spray algorithms 238 can also receive data from the smart spray 170, such as paint levels remaining and can process warnings about low paint levels for displaying to an operator on the display screen 202.

The holiday detector interface device 120 has also the capability to be removably connected to the holiday detector apparatus 102. For example, holiday detector interface device 120 is shown in FIG. 2 to include straps 250 that allow the holiday detector interface device 120 to be securely fastened to the holiday detector apparatus 102. The holiday detector interface device 120 can also be securely attached to the holiday detector using clips, friction fit, o-rings, screws or other mechanical fasteners, adhesives, etc. The holiday detector interface device 120 can be disconnected from one holiday detector apparatus 102 and work as an add-on to another manual holiday testing device to convert it into a "Smart" holiday detector. The holiday detector interface device 120 can be attached to the manual holiday detector using straps 250 and can also include a robust holding case to provide adequate protection for field work.

FIG. 3 is a schematic diagram of an example robotic system 300 for a holiday detection system 100 in accordance with embodiments of the present disclosure. The robotic system 300 can include a chassis 302 for mounting the holiday detection system 100. The chassis 302 can include a structural interface to mechanically secure the holiday detection system 100 to the robotic system 300. The chassis 302 can also include an electrical interface for the holiday detection system 100. The electrical interface can be used to provide a communications interface between the holiday detection system 100 and the robotic system 300. The chassis 302 can also include a housing for securely containing hardware elements that the robotic system 300 uses for controlling motion, including one or more processors, memory storing instructions for operating the robotic system 300, power supply, communications interface, etc.

The robotic system 300 can turn the holiday detection system into an automated or semi-automated system for movement on the testing surface during a holiday inspection. The robotic system 300 will facilitate the movement of the testing device with a controlled speed to maintain the speeding requirement based on information from, e.g., encoded wheels 160 or from other actuators or algorithmic processes. The robotic system 300 can be fastened on the external surface 306 of the coated equipment through magnetic wheels (which can be encoded or not). In addition, the robotic system 300 will reduce the safety risk of manual operating the holiday detection system 100 in elevated locations, submerged locations, locations with hazardous climate conditions, or otherwise dangerous locations. The robotic system 300 will be communicated to the holiday detector interface device 120 through wire or wireless connection for controlling the robotic system 300. For example, an operator can control the robotic system 300 using a graphical user interface on a mirrored application on a mobile device connected to the holiday detector interface device 120 by a wireless network connection. This way, the operator can remain in a safe location will still performing the holiday inspection.

FIG. 4 is a process flow diagram for using a graphical user interface device connected to a holiday detector for processing, displaying, and recoding holiday inspection data in accordance with embodiments of the present disclosure. FIG. 4 illustrates a flowchart of an example of a method 400 performed by a graphical user interface device in accordance with embodiments of the present. For clarity of presentation, the description that follows generally describes method 400 in the context of the other figures in this description. However, it will be understood that method 400 can be performed, for example, by any suitable system, environment, software, and hardware, or a combination of systems, environments, software, and hardware, as appropriate. In some implementations, various steps of method 400 can be run in parallel, in combination, in loops, or in any order.

At 402, optionally, a holiday detector interface device can establish a communications channel with a holiday detector apparatus. Communications can be established by performing a handshake between the communications module of holiday detector interface device and an interface protocol operating on the holiday detector apparatus. This handshake routine can allow the holiday detector interface device to learn about the way the holiday detector apparatus communication defect detection. That is, if the holiday detector apparatus is configured to signal different audible tones for different types or severities of defects, then the handshake routine can allow the holiday detector interface device to understand that for later processing of the audible tones. Other information can also be exchanged. The handshake routine can also be performed for the holiday detector interface device to learn about the operational capabilities of the holiday detector apparatus.

At 404, the holiday detector interface device can receiving audio signals representative of holiday inspection data from the holiday detector. In embodiments, the audio signals can be received through the audio interface or through a microphone.

At 406, the holiday detector interface device can interpret the received audio signals representative of holiday inspection data. For example, the audio signals can represent different types of defects or different severities of defects. In embodiments, the holiday detector interface device can reconcile noise from defect signaling through this interpretational subroutine.

At 408, the holiday detector interface device can generate a graphical representation of the holiday inspection data from the interpretations. The holiday detector interface device can create visual representations of the data for viewing by the operator.

At 410, the holiday detector interface device can display the graphical representations of the holiday inspection data on the display screen.

At 412, the holiday detector interface device can generate reports of holiday inspection data including graphical representations of holiday inspection data.

At 414, the holiday detector interface device can store holiday inspection data and reports of holiday inspection data. The holiday detector interface device can also perform other functions, such as communicating reports and other data to other locations using a wired or wireless communications protocol.

Figure 5:
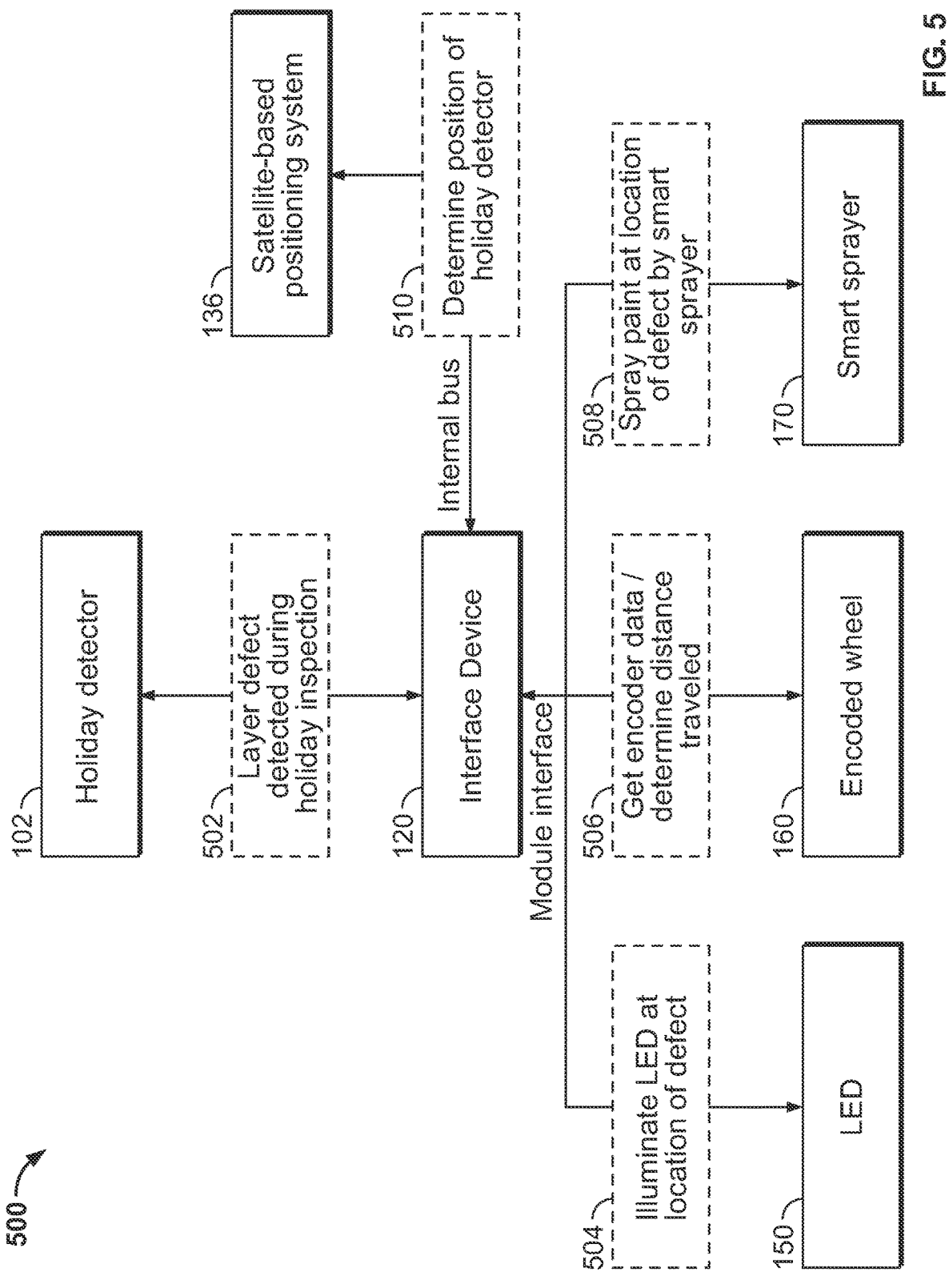
FIG. 5 is a schematic diagram illustrating example command flows from a connected holiday detector interface device to one or more peripheral devices for a holiday detection system in accordance with embodiments of the present disclosure.

FIG. 5 is a schematic diagram 500 illustrating example command flows from a connected holiday detector interface device to one or more peripheral devices for a holiday detection system in accordance with embodiments of the present disclosure. The holiday detector apparatus 102 can communicate a signal 502 indicating the detection of a defect in a surface coating or other type of non-metal layer on a metal structure. The holiday detector interface device 120 can communicate a signal 504 over the module interface for the LED 150 to illuminate an LED unit at a certain location to visually identify the defect location. The holiday detector interface device 120 can communicate a signal 508 over the module interface for the smart sprayer 170 to spray paint at a certain location to visually mark the defect location. The holiday detector interface device 120 can receive encoded wheel information over the module interface to determine in absolute or relativistic terms the position of the holiday detection system 100.

The holiday detector interface device can receive position coordinates from the satellite-based positioning system 136 over an internal bus (or external bus if an external positioning satellite-based positioning system is used) based on receiving a signal from the holiday detector of the presence of a defect.

FIG. 6 is a block diagram of an example computer system 600 used to provide computational functionalities associated with described algorithms, methods, functions, processes, flows, and procedures described in the present disclosure, according to some implementations of the present disclosure. The illustrated computer 602 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 602 can include input devices such as keypads, keyboards, and touch screens that can accept user information. Also, the computer 602 can include output devices that can convey information associated with the operation of the computer 602. The information can include digital data, visual data, audio information, or a combination of information. The information can be presented in a graphical user interface (UI) (or GUI).

The computer 602 can serve in a role as a client, a network component, a server, a database, a persistency, or components of a computer system for performing the subject matter described in the present disclosure. The illustrated computer 602 is communicably coupled with a network 630. In some implementations, one or more components of the computer 602 can be configured to operate within different environments, including cloud-computing-based environments, local environments, global environments, and combinations of environments.

At a top level, the computer 602 is an electronic computing device operable to receive, transmit, process, store, and manage data and information associated with the described subject matter. According to some implementations, the computer 602 can also include, or be communicably coupled with, an application server, an email server, a web server, a caching server, a streaming data server, or a combination of servers.

The computer 602 can receive requests over network 630 from a client application (for example, executing on another computer 602). The computer 602 can respond to the received requests by processing the received requests using software applications. Requests can also be sent to the computer 602 from internal users (for example, from a command console), external (or third) parties, automated applications, entities, individuals, systems, and computers.

Each of the components of the computer 602 can communicate using a system bus 603. In some implementations, any or all of the components of the computer 602, including hardware or software components, can interface with each other or the interface 604 (or a combination of both) over the system bus 603. Interfaces can use an application programming interface (API) 612, a service layer 613, or a combination of the API 612 and service layer 613. The API 612 can include specifications for routines, data structures, and object classes. The API 612 can be either computer-language independent or dependent. The API 612 can refer to a complete interface, a single function, or a set of APIs.

The service layer 613 can provide software services to the computer 602 and other components (whether illustrated or not) that are communicably coupled to the computer 602. The functionality of the computer 602 can be accessible for all service consumers using this service layer. Software services, such as those provided by the service layer 613, can provide reusable, defined functionalities through a defined interface. For example, the interface can be software written in JAVA, C++, or a language providing data in extensible markup language (XML) format. While illustrated as an integrated component of the computer 602, in alternative implementations, the API 612 or the service layer 613 can be stand-alone components in relation to other components of the computer 602 and other components communicably coupled to the computer 602. Moreover, any or all parts of the API 612 or the service layer 613 can be implemented as child or sub-modules of another software module, enterprise application, or hardware module without departing from the scope of the present disclosure.

The computer 602 includes an interface 604. Although illustrated as a single interface 604 in FIG. 6, two or more interfaces 604 can be used according to particular needs, desires, or particular implementations of the computer 602 and the described functionality. The interface 604 can be used by the computer 602 for communicating with other systems that are connected to the network 630 (whether illustrated or not) in a distributed environment. Generally, the interface 604 can include, or be implemented using, logic encoded in software or hardware (or a combination of software and hardware) operable to communicate with the network 630. More specifically, the interface 604 can include software supporting one or more communication protocols associated with communications. As such, the network 630 or the interface's hardware can be operable to communicate physical signals within and outside of the illustrated computer 602.

The computer 602 includes a processor 605. Although illustrated as a single processor 605 in FIG. 6, two or more processors 605 can be used according to particular needs, desires, or particular implementations of the computer 602 and the described functionality. Generally, the processor 605 can execute instructions and can manipulate data to perform the operations of the computer 602, including operations using algorithms, methods, functions, processes, flows, and procedures as described in the present disclosure.

The computer 602 also includes a database 606 that can hold data for the computer 602 and other components connected to the network 630 (whether illustrated or not). For example, database 606 can be an in-memory, conventional, or a database storing data consistent with the present disclosure. In some implementations, database 606 can be a combination of two or more different database types (for example, hybrid in-memory and conventional databases) according to particular needs, desires, or particular implementations of the computer 602 and the described functionality. Although illustrated as a single database 606 in FIG. 6, two or more databases (of the same, different, or combination of types) can be used according to particular needs, desires, or particular implementations of the computer 602 and the described functionality. While database 606 is illustrated as an internal component of the computer 602, in alternative implementations, database 606 can be external to the computer 602.

The computer 602 also includes a memory 607 that can hold data for the computer 602 or a combination of components connected to the network 630 (whether illustrated or not). Memory 607 can store any data consistent with the present disclosure. In some implementations, memory 607 can be a combination of two or more different types of memory (for example, a combination of semiconductor and magnetic storage) according to particular needs, desires, or particular implementations of the computer 602 and the described functionality. Although illustrated as a single memory 607 in FIG. 6, two or more memories 607 (of the same, different, or combination of types) can be used according to particular needs, desires, or particular implementations of the computer 602 and the described functionality. While memory 607 is illustrated as an internal component of the computer 602, in alternative implementations, memory 607 can be external to the computer 602.

The application 608 can be an algorithmic software engine providing functionality according to particular needs, desires, or particular implementations of the computer 602 and the described functionality. For example, application 608 can serve as one or more components, modules, or applications. Further, although illustrated as a single application 608, the application 608 can be implemented as multiple applications 608 on the computer 602. In addition, although illustrated as internal to the computer 602, in alternative implementations, the application 608 can be external to the computer 602.

In embodiments, application 608 can include a software application that can provide comprehensive control over the features of the holiday detector apparatus 102. For example, a holiday detector application 608 that can be downloaded onto a mobile computer or smartphone or other user interface device. The holiday detector application 608 can include code that can be executed by processor 605 to perform instructions, such as display holiday inspection status information, provide reports and data, provide data from each of the LED, smart sprayer, encoded wheel, GPS, and other enhancements. For example, the holiday detector application 608 can provide data associated with holiday inspection results, including GPS coordinates of each holiday detected, linear motion information from encoded wheel, and spray status and paint levels. The holiday detector application 608 can also include code that includes instructions for controlling one or more of the holiday detector apparatus itself, LED, smart sprayer, encoded wheel, robotic system, GPS, etc. The holiday detector application 608 can rely on API 612 interpret data communicated by the any holiday detector apparatus or the holiday detector graphical user interface device 120 by a wired or wireless connection.

The holiday detector application 608 can also provide mirroring capabilities with the holiday detector graphical user interface device 120. For example, the holiday detector application 608 can mirror the display of the holiday detector graphical user interface device 120. The holiday detector application 608 can also include the software features of the holiday detector graphical user interface device 120, including the control features, data recording, document creation and retention, security, and other software functions.

The computer 602 can also include a power supply 614. The power supply 614 can include a rechargeable or non-rechargeable battery that can be configured to be either user- or non-user-replaceable. In some implementations, the power supply 614 can include power-conversion and management circuits, including recharging, standby, and power management functionalities. In some implementations, the power-supply 614 can include a power plug to allow the computer 602 to be plugged into a wall socket or a power source to, for example, power the computer 602 or recharge a rechargeable battery.

There can be any number of computers 602 associated with, or external to, a computer system containing computer 602, with each computer 602 communicating over network 630. Further, the terms "client," "user," and other appropriate terminology can be used interchangeably, as appropriate, without departing from the scope of the present disclosure. Moreover, the present disclosure contemplates that many users can use one computer 602 and one user can use multiple computers 602.

Described implementations of the subject matter can include one or more features, alone or in combination.

For example, in a first implementation, a computer-implemented method includes the following.

Example 1 is a holiday detector system that includes a holiday detector apparatus that includes a housing comprising holiday inspection circuitry to perform holiday inspection on a surface, and a probe extending from the housing for surface inspection, the probe electrically coupled to the holiday inspection circuitry; and a graphical user interface device electrically coupled to the holiday detector apparatus, the graphical user interface device comprising a display screen and circuitry to receive holiday inspection signals from the holiday detector apparatus, generate digital data representative of the holiday inspection signals, format the digital data into a graphical representation of the holiday inspection signals, display the graphical representation of the holiday inspection signals on the display screen, and digitally store the digital data in a data storage device.

Example 2 may include the subject matter of example 1, wherein the holiday detector apparatus comprises a peripheral device interface to receive a connector for a peripheral device; and wherein the graphical user interface device is electrically coupled to the holiday detector by the peripheral device interface.

Example 3 may include the subject matter of example 2, wherein the peripheral device interface comprises an audio jack, and wherein the graphical user interface device is electrically connected to the holiday detector through the audio jack and is configured to receive the holiday inspection signals from the holiday detector apparatus through a connection to the audio jack.

Example 4 may include the subject matter of any of examples 1-3, wherein the graphical user interface device comprises logic and circuitry to convert audio outputs from the holiday detector that represent holiday inspection signals into graphical representations of the holiday inspection signals; and display the graphical representations of the holiday inspection signals on the display screen.

Example 5 may include the subject matter of any of examples 1-4, wherein the graphical user interface device comprises a satellite-based positioning system, and logic and circuitry to receive an indication of a presence of a holiday from the holiday detector; determine a position of the holiday detector based on a position of the holiday detector using the satellite-based positioning system; store the position of the holiday using coordinates from the satellite-based positioning system; and display the position of the holiday on the display screen.

Example 6 may include the subject matter of any of examples 1-5, wherein the graphical user interface comprises a communication interface to send digital data to a communications device.

Example 7 may include the subject matter of any of examples 1-6, wherein the graphical user interface device comprises a module interface for connecting modular accessories to the graphical user interface by a wired or by a wireless connection.

Example 8 may include the subject matter of example 7, further comprising a light emitting diode (LED) mechanically coupled to the probe and communicably coupled to the graphical user interface device through the module interface, the graphical user interface device comprising logic and circuitry to control the LED to illuminate in response to the holiday detector detecting a holiday during a holiday inspection of the surface.

Example 9 may include the subject matter of example 7, further comprising a smart sprayer mechanically coupled to the probe and communicably coupled to the graphical user interface device through the module interface, the graphical user interface device comprising logic and circuitry to cause the smart sprayer to emit paint onto the surface based on the detection of a holiday by the holiday detector during a holiday inspection of the surface.

Example 10 may include the subject matter of example 7, further comprising an encoded wheel mechanically coupled to the holiday detector and communicably coupled to the graphical user interface through the module interface, the encoded wheel configured with rotational tracking data to determine a distance traveled; and wherein the graphical user interface device comprises logic and circuitry to receive movement data from the encoded wheel and to determine a distance travelled by the holiday detector based on movement data received from the encoded wheel.

Example 11 may include the subject matter of example 10, wherein the encoded wheel comprises a magnetic element to secure the encoded wheel to the surface, the graphical user interface device further comprising logic and circuitry to control the encoded wheel to move along the surface at a predetermined speed.

Example 12 is a computer-implemented method that includes receiving, by a graphical user interface device electrically connected to an audio output jack of a holiday detector, an auditory signal representing holiday inspection analysis data from the holiday detector from a holiday inspection of a surface; converting the auditory signal into a graphical representation of the holiday inspection analysis data; displaying the graphical representation on a display screen of the graphical user interface device; and storing the data in a data storage device.

Example 13 may include the subject matter of example 12, and can also include receiving, by the graphical user interface device, an audio signal comprising an indication of a presence of a holiday on the surface from the holiday detector; determining a position of the holiday detector based on a position of the holiday detector using a satellite-based positioning system in communication with a processor of the graphical user interface device; storing the position of the holiday using coordinates from the satellite-based positioning system; and displaying the position of the holiday on the display screen.

Example 14 may include the subject matter of any of examples 12-13, and can also include receiving, by the graphical user interface device, an audio signal comprising an indication of a presence of a holiday on the surface from the holiday detector; and controlling and LED coupled to the holiday detector to illuminate a location of the holiday in response to the holiday detector detecting the presence of the holiday during a holiday inspection of the surface.

Example 15 may include the subject matter of any of examples 12-14, and can also include receiving, by the graphical user interface device, an audio signal comprising an indication of a presence of a holiday on the surface from the holiday detector; and causing, by the graphical user interface device, a sprayer to emit paint onto the surface based on the detection of a holiday by the holiday detector during a holiday inspection of the surface.

Example 16 may include the subject matter of any of examples 12-15, and can also include receiving movement data from an encoded wheel coupled to the holiday detector; and determining a distance travelled by the holiday detector based on movement data received from the encoded wheel.

Example 17 may include the subject matter of example 16, wherein the encoded wheel comprises a magnetic element to secure the encoded wheel to the surface, the method can also include controlling, by the graphical user interface device, the encoded wheel to move along the surface at a predetermined speed.

Example 18 is a non-transitory computer-readable storage medium storing instructions that, when executed by one or more hardware processors, perform operations including receiving, by a graphical user interface device electrically connected to an audio output jack of a holiday detector, an auditory signal representing holiday inspection analysis data from the holiday detector from a holiday inspection of a surface; converting the auditory signal into a graphical representation of the holiday inspection analysis data; displaying the graphical representation on a display screen of the graphical user interface device; and storing the data in a data storage device.

Example 19 may include the subject matter of example 18, wherein the operations further include receiving, by the graphical user interface device, an audio signal comprising an indication of a presence of a holiday on the surface from the holiday detector; determining a position of the holiday detector based on a position of the holiday detector using a satellite-based positioning system in communication with a processor of the graphical user interface device; storing the position of the holiday using coordinates from the satellite-based positioning system; and displaying the position of the holiday on the display screen.

Example 20 may include the subject matter of any of examples 18-19, wherein the operations can also include receiving, by the graphical user interface device, an audio signal comprising an indication of a presence of a holiday on the surface from the holiday detector; and controlling and LED coupled to the holiday detector to illuminate a location of the holiday in response to the holiday detector detecting the presence of the holiday during a holiday inspection of the surface.

Example 21 may include the subject matter of any of examples 18-20, the operations further include receiving, by the graphical user interface device, an audio signal comprising an indication of a presence of a holiday on the surface from the holiday detector; determining a position of the holiday detector based on a position of the holiday detector using a satellite-based positioning system in communication with a processor of the graphical user interface device; storing the position of the holiday using coordinates from the satellite-based positioning system; and displaying the position of the holiday on the display screen.

Example 22 may include the subject matter of any of examples 18-21, the operations further include receiving, by the graphical user interface device, an audio signal comprising an indication of a presence of a holiday on the surface from the holiday detector; and controlling and LED coupled to the holiday detector to illuminate a location of the holiday in response to the holiday detector detecting the presence of the holiday during a holiday inspection of the surface.

Example 23 may include the subject matter of any of examples 18-22, the operations further include receiving, by the graphical user interface device, an audio signal comprising an indication of a presence of a holiday on the surface from the holiday detector; and causing, by the graphical user interface device, a sprayer to emit paint onto the surface based on the detection of a holiday by the holiday detector during a holiday inspection of the surface.

Example 24 may include the subject matter of any of examples 18-23, the operations further include receiving, receiving movement data from an encoded wheel coupled to the holiday detector; and determining a distance travelled by the holiday detector based on movement data received from the encoded wheel.

Example 25 may include the subject matter of any of examples 18-24, the operations further include a magnetic element to secure the encoded wheel to the surface, the operations further comprise controlling, by the graphical user interface device, the encoded wheel to move along the surface at a predetermined speed.

Example 26 is a software application comprising code that includes instructions that, when executed by a hardware processor, perform operations. the software application can include code to control the LED, the smart sprayer, the encoded wheel, the robotic system, and the holiday detector apparatus. The software application can also include code that includes instructions that, when executed by a hardware processor, perform operations, including receiving data from one or more of the LED, the smart sprayer, the encoded wheel, the robotic system, the holiday detector apparatus, the GPS, and other components, across a wired or wireless communications link. The software application can be downloaded onto a mobile device, such as a tablet PC, smartphone, or other type of mobile computing and communications device. The software application can provide a graphical user interface to control one or more of the holiday detector apparatus system features, including receiving data, generating reports, storing data and reports, emailing reports and data to other devices, etc. The software application can also mirror the holiday detector GUI device.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non transitory, computer-readable computer-storage medium for execution by, or to control the operation of, data processing apparatus. Alternatively, or additionally, the program instructions can be encoded in/on an artificially generated propagated signal. For example, the signal can be a machine-generated electrical, optical, or electromagnetic signal that is generated to encode information for transmission to a suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatuses, devices, and machines for processing data, including by way of example, a programmable processor, a computer, or multiple processors or computers. The apparatus can also include special purpose logic circuitry including, for example, a central processing unit (CPU), a field-programmable gate array (FPGA), or an application specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, such as LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as stand alone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory.

Graphics processing units (GPUs) can also be used in combination with CPUs. The GPUs can provide specialized processing that occurs in parallel to processing performed by CPUs. The specialized processing can include artificial intelligence (AI) applications and processing, for example. GPUs can be used in GPU clusters or in multi-GPU computing.

A computer can include, or be operatively coupled to, one or more mass storage devices for storing data. In some implementations, a computer can receive data from, and transfer data to, the mass storage devices including, for example, magnetic, magneto optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer readable media (transitory or non-transitory, as appropriate) suitable for storing computer program instructions and data can include all forms of permanent/non-permanent and volatile/non volatile memory, media, and memory devices. Computer readable media can include, for example, semiconductor memory devices such as random access memory (RAM), read only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer readable media can also include, for example, magnetic devices such as tape, cartridges, cassettes, and internal/removable disks. Computer readable media can also include magneto optical disks and optical memory devices and technologies including, for example, digital video disc (DVD), CD ROM, DVD+/−R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated into, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device that the user uses. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch-screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship.

Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations. It should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system including a computer memory interoperably coupled with a hardware processor configured to perform the computer-implemented method or the instructions stored on the non-transitory, computer-readable medium.

What is claimed is:

1. A holiday detector system comprising:
a holiday detector apparatus comprising:
    a housing comprising holiday inspection circuitry to perform holiday inspection on a surface; and
    a probe extending from the housing for surface inspection, the probe electrically coupled to the holiday inspection circuitry;
a graphical user interface device electrically coupled to the holiday detector apparatus, wherein the graphical user interface device comprises a module interface for connecting modular accessories to the graphical user interface device by a wired or by a wireless connection, and wherein the graphical user interface device comprises a display screen and circuitry to:
    receive holiday inspection signals from the holiday detector apparatus, wherein the holiday inspection signals comprise auditory signals representing holiday inspection analysis data from the holiday inspection;
    generate digital data representative of the holiday inspection signals;
    format the digital data into a graphical representation of the holiday inspection signals;
    display the graphical representation of the holiday inspection signals on the display screen; and
    digitally store the digital data in a data storage device; and,
an encoded wheel mechanically coupled to the holiday detector apparatus and communicably coupled to the graphical user interface device through the module interface, wherein the encoded wheel is configured with rotational tracking data to determine a distance traveled, and wherein the graphical user interface device comprises logic and circuitry to receive movement data from the encoded wheel and to determine a distance travelled by the holiday detector apparatus based on movement data received from the encoded wheel.

2. The holiday detector system of claim 1, wherein the holiday detector apparatus comprises a peripheral device interface to receive a connector for a peripheral device; and wherein the graphical user interface device is electrically coupled to the holiday detector apparatus by the peripheral device interface.

3. The holiday detector system of claim 2, wherein the peripheral device interface comprises an audio jack, and wherein the graphical user interface device is electrically connected to the holiday detector apparatus through the audio jack and is configured to receive the holiday inspection signals from the holiday detector apparatus through a connection to the audio jack.

4. The holiday detector system of claim 1, wherein the graphical user interface device comprises logic and circuitry to:
    convert audio outputs from the holiday detector apparatus that represent holiday inspection signals into graphical representations of the holiday inspection signals; and
    display the graphical representations of the holiday inspection signals on the display screen.

5. The holiday detector system of claim 1, wherein the graphical user interface device comprises a satellite-based positioning system, and logic and circuitry to:
    receive an indication of a presence of a holiday from the holiday detector apparatus;
    determine a position of the holiday detector apparatus using the satellite-based positioning system;
    store the position of the holiday using coordinates from the satellite-based positioning system; and
    display the position of the holiday on the display screen.

6. The holiday detector system of claim 1, wherein the graphical user interface device comprises a communication interface to send digital data to a communications device.

7. The holiday detector system of claim 1, further comprising a light emitting diode (LED) mechanically coupled to the probe and communicably coupled to the graphical user interface device through the module interface, the graphical user interface device comprising logic and circuitry to control the LED to illuminate in response to the holiday detector apparatus detecting a holiday during a holiday inspection of the surface.

8. The holiday detector system of claim 1, further comprising a smart sprayer mechanically coupled to the probe and communicably coupled to the graphical user interface device through the module interface, the graphical user interface device comprising logic and circuitry to cause the smart sprayer to emit paint onto the surface based on detection of a holiday by the holiday detector apparatus during a holiday inspection of the surface.

9. The holiday detector system of claim 1, wherein the encoded wheel comprises a magnetic element to secure the encoded wheel to the surface, the graphical user interface device further comprising logic and circuitry to control the encoded wheel to move along the surface at a predetermined speed.

10. A computer-implemented method comprising:
    receiving, by a graphical user interface device electrically connected to an audio output jack of a holiday detector apparatus, an auditory signal representing holiday inspection analysis data from the holiday detector apparatus from a holiday inspection of a surface;
    converting the auditory signal into a graphical representation of the holiday inspection analysis data;
    displaying the graphical representation on a display screen of the graphical user interface device;
    storing the holiday inspection analysis data in a data storage device;
    receiving movement data from an encoded wheel coupled to the holiday detector apparatus; and
    determining a distance travelled by the holiday detector apparatus based on movement data received from the encoded wheel.

11. The computer-implemented method of claim 10, further comprising:

receiving, by the graphical user interface device, an audio signal comprising an indication of a presence of a holiday on the surface from the holiday detector apparatus;

determining a position of the holiday detector apparatus using a satellite-based positioning system in communication with a processor of the graphical user interface device;

storing the position of the holiday using coordinates from the satellite-based positioning system; and displaying the position of the holiday on the display screen.

12. The computer-implemented method of claim 10, further comprising:

receiving, by the graphical user interface device, an audio signal comprising an indication of a presence of a holiday on the surface from the holiday detector apparatus; and controlling and LED coupled to the holiday detector apparatus to illuminate a location of the holiday in response to the holiday detector apparatus detecting the presence of the holiday during a holiday inspection of the surface.

13. The computer-implemented method of claim 10, further comprising:

receiving, by the graphical user interface device, an audio signal comprising an indication of a presence of a holiday on the surface from the holiday detector apparatus; and causing, by the graphical user interface device, a sprayer to emit paint onto the surface based on detection of a holiday by the holiday detector apparatus during a holiday inspection of the surface.

14. The computer-implemented method of claim 10, wherein the encoded wheel comprises a magnetic element to secure the encoded wheel to the surface, the method further comprising:

controlling, by the graphical user interface device, the encoded wheel to move along the surface at a predetermined speed.

15. A non-transitory computer-readable storage medium storing instructions that, when executed by one or more hardware processors, perform operations comprising:

receiving, by a graphical user interface device electrically connected to an audio output jack of a holiday detector apparatus, an auditory signal representing holiday inspection analysis data from the holiday detector apparatus from a holiday inspection of a surface;

converting the auditory signal into a graphical representation of the holiday inspection analysis data;

displaying the graphical representation on a display screen of the graphical user interface device;

storing the holiday inspection analysis data in a data storage device;

receiving movement data from an encoded wheel coupled to the holiday detector apparatus; and determining a distance travelled by the holiday detector apparatus based on movement data received from the encoded wheel.

16. The non-transitory, computer-readable storage medium of claim 15, wherein the operations further comprise:

receiving, by the graphical user interface device, an audio signal comprising an indication of a presence of a holiday on the surface from the holiday detector apparatus;

determining a position of the holiday detector apparatus using a satellite-based positioning system in communication with a processor of the graphical user interface device;

storing the position of the holiday using coordinates from the satellite-based positioning system; and displaying the position of the holiday on the display screen.

17. The non-transitory, computer-readable storage medium of claim 15, wherein the operations further comprise:

receiving, by the graphical user interface device, an audio signal comprising an indication of a presence of a holiday on the surface from the holiday detector apparatus; and controlling and LED coupled to the holiday detector apparatus to illuminate a location of the holiday in response to the holiday detector apparatus detecting the presence of the holiday during a holiday inspection of the surface.

* * * * *